US012575385B2

(12) United States Patent
Sakurai et al.

(10) Patent No.: US 12,575,385 B2
(45) Date of Patent: Mar. 10, 2026

(54) ETCHING METHOD, ETCHING APPARATUS, MANUFACTURING METHOD OF SEMICONDUCTOR DEVICE, AND MANUFACTURING METHOD OF TEMPLATE

(71) Applicant: Kioxia Corporation, Tokyo (JP)

(72) Inventors: Noriko Sakurai, Yokohama Kanagawa (JP); Takeharu Motokawa, Zushi Kanagawa (JP); Hideaki Sakurai, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 709 days.

(21) Appl. No.: 17/930,637

(22) Filed: Sep. 8, 2022

(65) Prior Publication Data

US 2023/0307233 A1 Sep. 28, 2023

(30) Foreign Application Priority Data

Mar. 24, 2022 (JP) ................................. 2022-048499

(51) Int. Cl.
H01L 21/033 (2006.01)
H01L 21/3065 (2006.01)
H01L 21/67 (2006.01)

(52) U.S. Cl.
CPC ...... H01L 21/0332 (2013.01); H01L 21/0337 (2013.01); H01L 21/3065 (2013.01); H01L 21/67063 (2013.01)

(58) Field of Classification Search
CPC ............. H01L 21/0332; H01L 21/0337; H01L 21/3065; H01L 21/67063; H01L 21/31116; G03F 7/0002; G03F 1/80; H01J 37/3244; H01J 37/32449; H01J 2237/334

USPC ............................. 430/5, 313, 314, 323, 324
See application file for complete search history.

(56) References Cited

U.S. PATENT DOCUMENTS

| | | | | |
|---|---|---|---|---|
| 9,793,135 | B1 * | 10/2017 | Zaitsu | ............... H01L 21/30655 |
| 2004/0264044 | A1 | 12/2004 | Konishi et al. | |
| 2008/0099039 | A1 | 5/2008 | Krassnitzer et al. | |
| 2009/0057133 | A1 * | 3/2009 | Kouznetsov | .......... C23C 14/352 |
| | | | | 204/192.12 |
| 2016/0293432 | A1 | 10/2016 | Ranjan et al. | |
| 2018/0350620 | A1 * | 12/2018 | Zaitsu | ............... H01L 21/31122 |

(Continued)

FOREIGN PATENT DOCUMENTS

| | | |
|---|---|---|
| JP | H7-142447 A | 6/1995 |
| JP | 2002-294470 A | 10/2002 |
| JP | 2005-18844 A | 1/2005 |

(Continued)

OTHER PUBLICATIONS

Clarivate Analytics (Year: 1991).*

*Primary Examiner* — Caleen O Sullivan
(74) *Attorney, Agent, or Firm* — Finnegan, Henderson, Farabow, Garrett & Dunner, LLP

(57) ABSTRACT

An example of an etching method according to the present disclosure, includes: performing a first process which includes forming a first layer containing halogen or holding the substrate in a gas atmosphere containing halogen; and performing a second process which includes removing a portion of the first layer and a portion of the substrate under the portion of the first layer by supplying the portion of the first layer with ions sourced from a solid material.

7 Claims, 25 Drawing Sheets

(56)         References Cited

U.S. PATENT DOCUMENTS

2020/0312670 A1*  10/2020  Smith  ...............  H01J 37/32422
2025/0191906 A1*   6/2025  Terui  .................  C23C 16/45534

FOREIGN PATENT DOCUMENTS

JP         2010-507239  A      3/2010
JP         2016-201574  A     12/2016
JP         2018-510515  A      4/2018
JP          2021-68860  A      4/2021

* cited by examiner

ETCHING METHOD, ETCHING APPARATUS, MANUFACTURING METHOD OF SEMICONDUCTOR DEVICE, AND MANUFACTURING METHOD OF TEMPLATE

CROSS-REFERENCE TO RELATED APPLICATION

This application is based upon and claims the benefit of priority from the prior Japanese Patent Application No. 2022-048499, filed on Mar. 24, 2022, the entire contents of which are incorporated herein by reference.

BACKGROUND OF THE INVENTION

Field of the Invention

Embodiments of the present disclosure relate to an etching method, an etching apparatus, a manufacturing method of a semiconductor device, and a manufacturing method of a template.

Description of the Related Art

Nanoimprint lithography is known as a method of forming a pattern on a substrate such as a semiconductor substrate. Nanoimprint lithography is a technique that can transfer a fine pattern by embossing a template (mold, die) as an original plate onto a resist resin. Nanoimprint lithography, which is simple in its process because of its process nature, has been attracting attention as a technique that can mass-produce structural bodies to which fine patterns are transferred at low cost with good reproducibility, and thus, under active researches and developments currently.

BRIEF DESCRIPTION OF THE DRAWINGS

FIGS. 6A to 6F each are a process flow schematically showing an example of a method of manufacturing a semiconductor device by etching a semiconductor substrate (Si wafer) on which an insulating film is formed by using the etching apparatus 100 shown in FIG. 1; and appropriately forming a conductor layer or the like.

DETAILED DESCRIPTION OF PREFERRED EMBODIMENTS

Figure 1:
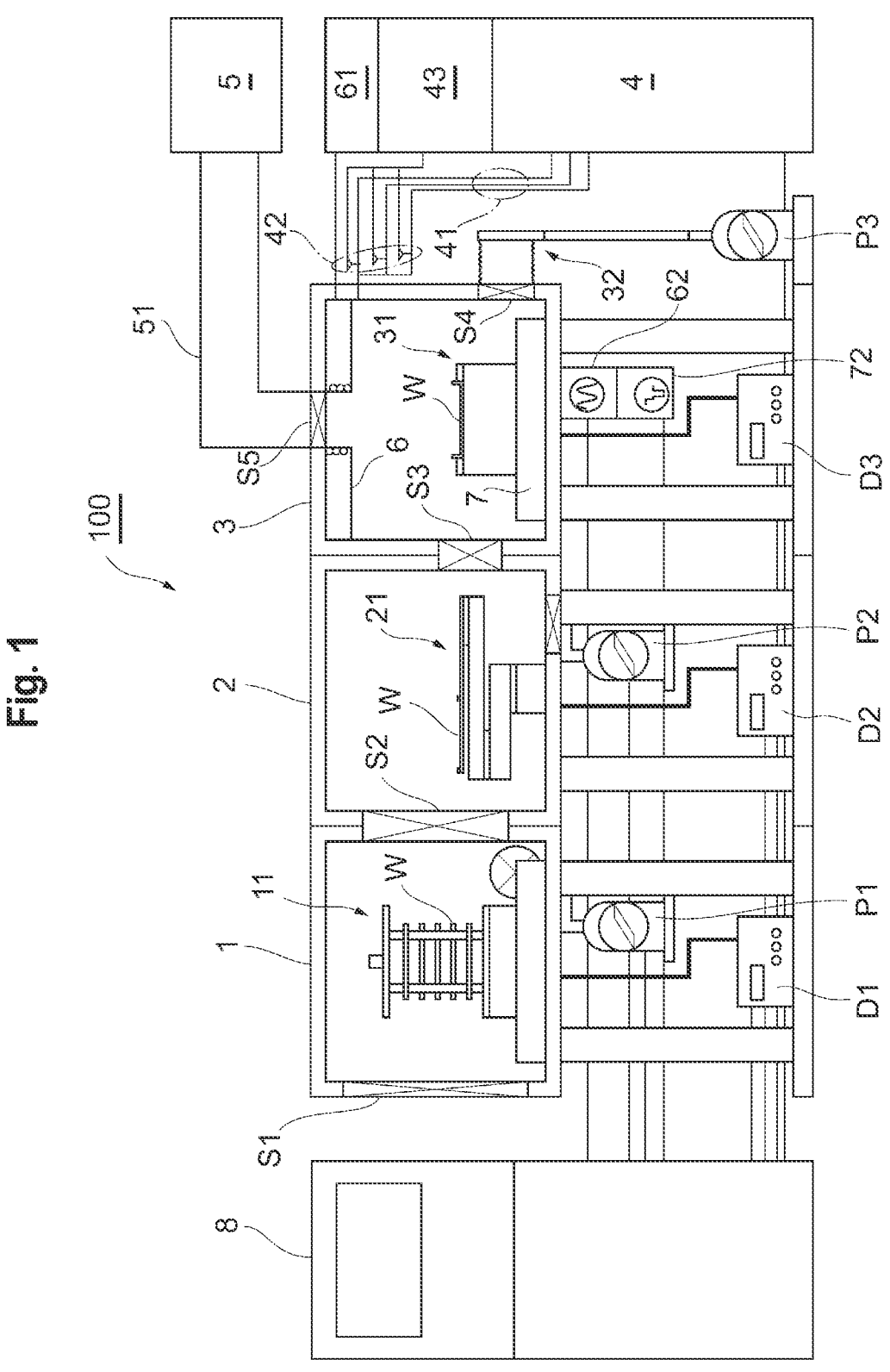
FIG. 1 is a schematic plan view showing a schematic configuration of an example of a substrate processing apparatus according to an embodiment of the present disclosure.

Hereinafter, embodiments according to an example of the present disclosure will be described with reference to the drawings. It should be noted that the embodiments described below are merely examples and are not intended to exclude applications of various modifications and techniques that are not specified below. That is, one example of the present disclosure can be variously modified and carried out without departing from the spirit of the present disclosure. In addition, in the description of the following drawings, the same or similar parts are designated by the same or similar reference numerals, and the drawings are schematic and do not necessarily match the actual dimensions, ratios, and the like. Further, there may be portions where the relations and ratios of the dimensions in the drawings are different from each other. The embodiments and the like described below are merely parts of the embodiments and the like of the present disclosure and are not all the embodiments. Moreover, based on the embodiments and the like of the present disclosure, any other embodiments and the like obtained by a person skilled in the art without requiring a creative act is included in the scope of protection of the present disclosure.

In the present disclosure, one "part" or "device" (a concept that can be paraphrased as a "machine", "vessel", "means", "mechanism", "system", etc. The same applies hereinafter), and functions of their components and elements may be realized by two or more physical means, devices, or the like; and alternatively, the functions of two or more "parts" or "devices", and their components and elements may be realized by one physical means, device, or the like. This also applies to "processes" and "steps".

First Embodiment: Configuration Example of Etching Apparatus

FIG. 1 is a schematic plan view showing a schematic configuration of an example of the etching apparatus according to one embodiment of the present disclosure. The etching apparatus 100 has a configuration in which a holding chamber 1, followed by a conveyance chamber 2 and a processing chamber 3, which are communicatively connected to one another.

The holding chamber 1 includes a holder 11 that holds, for example, a plurality of substrates W that are carried in from the outside via a shutter S1. A pump P1 that discharges (evacuates) an atmospheric gas inside the holding chamber 1 and a power source D1 for driving the holder 11, the shutter S1, and the like are connected to the holding chamber 1. In this case, the substrates W include, for example, translucent substrates that includes a translucent material, and examples thereof may include quartz substrates, and the like. However, the "substrates" in the present disclosure are not limited thereto, and represent a concept including all workpieces having portions that can be subjected to surface-layer processing; and the "substrates", for example, may include quartz substrates to be formed into original plates such as templates for nanoimprint lithography and photomasks for nanoimprint lithography, as well as silicon substrates for semiconductor devices (including semi-finished products in the manufacturing process), silicon wafers, any other processed substrates, and the like. In addition, those in which appropriate patterns made of other materials are formed on the above substrates are also included.

The conveyance chamber 2 includes a single-wafer loader 21 that receives substrates W from the holding chamber 1 via the shutter S2 and carries out the substrates W to the processing chamber 3 via the shutter S3. A pump P2 that discharges the atmospheric gas inside the conveyance chamber 2, and a power source D2 for driving the loader 21, the shutter S2, and the like are connected to the conveyance chamber 2.

The processing chamber 3 includes a holder 31 that holds the substrates W carried in via the shutter S3 by the conveyance chamber 2. The pump P2 that discharges the atmospheric gas inside the processing chamber 3 is connected via a pipe 32 and a shutter S4 to the processing chamber 3. A power source D3 for driving the holder 31, the shutters S3, S4, S5, and the like (the shutter S5 will be described later) is connected to the processing chamber 3.

With these configurations, the substrates W are conveyed from the outside into the processing chamber 3 via the holding chamber 1 and the conveyance chamber 2 in sequence; and reversely, the substrates W are conveyed to the outside from the processing chamber 3 via the conveyance chamber 2 and the holding chamber 1 in sequence.

The processing chamber 3 is one of major components for performing dry processing such as dry etching and film formation that includes CVD (Chemical Vapor Deposition) or sputtering process relative to the substrates W, and a gas supply source 4 for supplying a predetermined gas into the processing chamber 3 is connected to the processing chamber 3 via a plurality of pipes 41. Further, each pipe 41 is provided with an on-off valve 42, and each on-off valve 42 is connected to a mass-flow controller (MFC) 43 that regulates the flow rate of the gas supplied in accordance with the opening-closing degree of the valve. The gas supply source 4 stores, for example, a gas containing halogen such as carbon tetrafluoride ($CF_4$), a hydrocarbon gas such as acetylene ($C_2H_2$) and methane ($CH_4$), and an inert gas such as argon (Ar), neon (Ne), nitrogen ($N_2$), and oxygen ($O_2$); and these gases are configured to be appropriately selected in accordance with the processing steps and be supplied into the processing chamber 3.

An ion supply source 5 for supplying carbon ions (e.g., $C^+$) into the processing chamber 3 is connected to an upper lid of the processing chamber 3 via a conduction pipe 51 and the shutter S5. A filtered cathodic vacuum arc (FCVA) system is adopted for the ion supply source 5, and this ion supply source 5 includes: a discharge mechanism that causes an arc discharge to a solid material of carbon such as graphite; and an electromagnetic space filter that eliminates droplets (particulate radicals) from a product resultant from the arc discharge to the solid material, and extracts $C^+$.

Further, an upper part of the processing chamber 3 (near the shutter S5) is provided with a high frequency electrode 6 that applies a high frequency (RF) voltage to a halogen-containing gas such as $CF_4$ (a "$CF_4$ gas" will be described as an example, hereinafter) to generate radicals such as F* and CF*. A lower part of the holder 31 in the processing chamber 3 is provided with a bias electrode 7 that applies a bias voltage to the substrates W (the bias electrode 7, the holder 31, and the substrates W are electrically connected to one another). A rate modulation unit 61 that utilizes an electronic lens in which an electromagnet or the like is arranged to cause ion convergence, and a voltage controller 62 that regulates a high frequency voltage are connected to the high frequency electrode 6. A voltage controller 72 that regulates a bias voltage along with its polarity is connected to the bias electrode 7. Each device and each power source are connected to a power source control box 8 and are supplied with electric power required for them from the power source control box 8.

As aforementioned, the etching apparatus 100, the substrates W, the processing chamber 3, the ion supply source 5, and the rate modulation unit 61 correspond to one example of an "etching apparatus", "substrates", a "chamber", an "ion supplier", and an "irradiator" according to the present disclosure, respectively. The gas supply source 4, the high frequency electrode 6, and the voltage controller 62 are included in an example of a "gas supplier that supplies a chemical species derived from a gas containing halogen into a chamber" according to the present disclosure. Further, the bias electrode 7 and the voltage controller 72 are included in an example of a "voltage application circuit" according to the present disclosure. The opening and closing of the shutters S1 to S5 is controlled by a shutter controller (not shown).

Second Embodiment: Example of Etching Method

1

Figure 2:
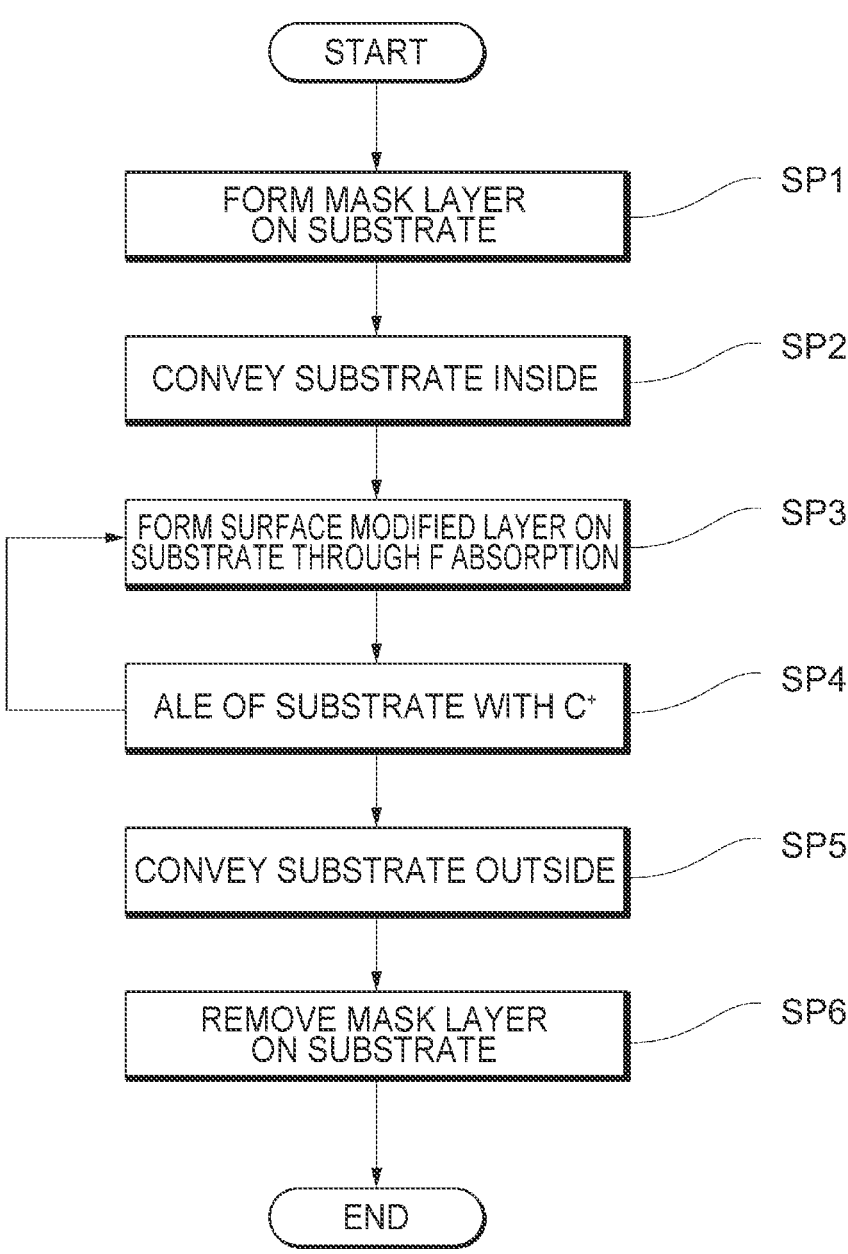
FIG. 2 is a flow chart showing an example of the procedure of etching a substrate by using an etching apparatus shown in FIG. 1 to form a template for nanoimprint lithography.
Figure 3A:
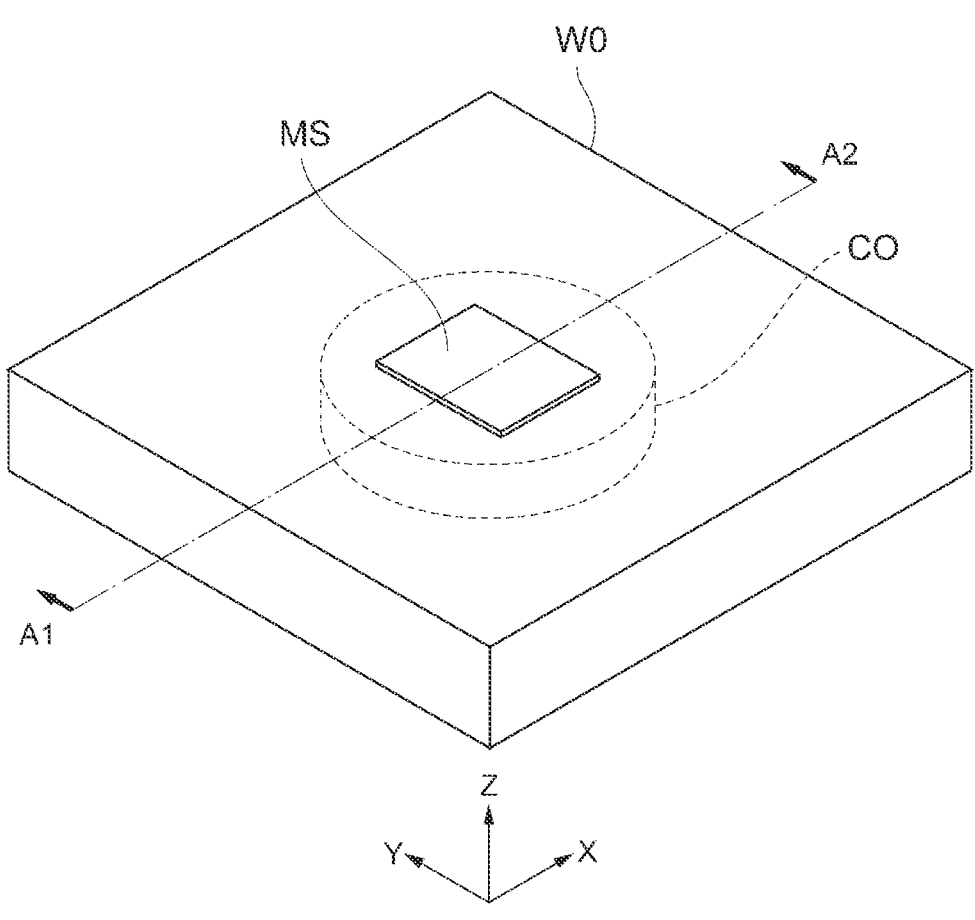
FIGS. 3A and 3B respectively are a schematic perspective view and a schematic cross-sectional view of an example of the structure of a substrate that is used.
Figure 3B:
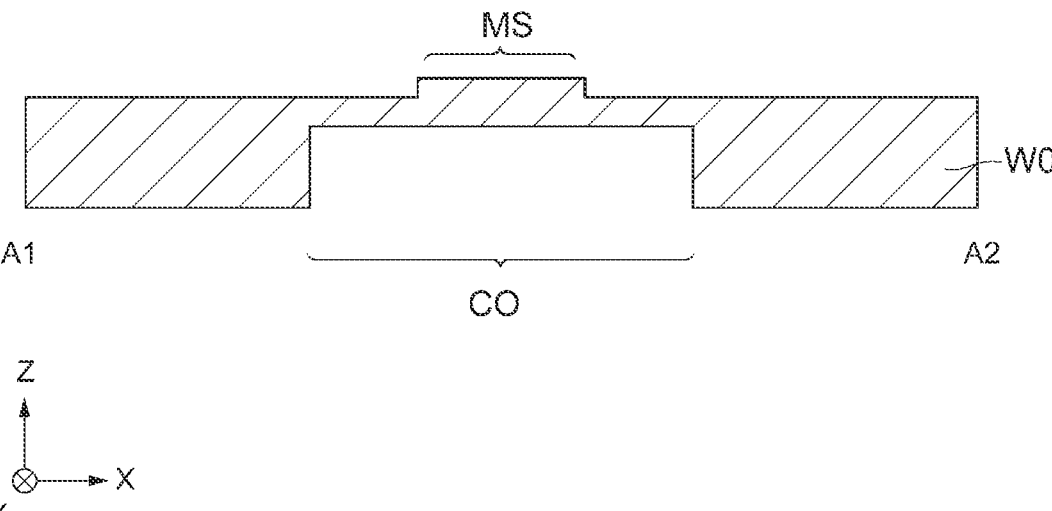

FIG. 2 is a flow chart showing an example of the procedure of etching a rectangular substrate (quartz substrate) having a mesa structure by using the etching apparatus 100 shown in FIG. 1 so as to form a template for nanoimprint lithography having a pattern. FIG. 3A is a schematic perspective view and FIG. 3B is a schematic cross-sectional view each showing an example of the structure of a substrate that is used; and FIG. 3B is a cross-sectional view taken along a line A1-A2 in FIG. 3A. In addition, FIGS. 4A to 4H are views of the process flow schematically showing an example of a state in which the procedure is being executed and an example of a state in which the fabricated template is used. In FIGS. 4A to 4H, a cross section of a part of the substrate is shown for convenience of understanding.

A substrate W0 has a rectangular shape in general, and has a flat surface MS referred to as a mesa and an aperture C with a larger diameter than that of the flat surface MS in a lower part of the drawing. In this substrate W0, a pattern including an alignment mark pattern and an imprint pattern is formed in the flat surface MS by a method described later. The alignment mark pattern is a mark for alignment (alignment mark), and the imprint pattern is a pattern desired to be transferred by a pattern forming method using nanoimprint lithography. The numbers, positions, and shapes of the alignment mark pattern and the imprint pattern are not particularly limited, and examples thereof include an imprint pattern including a plurality of pillars, an alignment mark pattern including a cross-shaped groove, and the like.

Figure 4A:
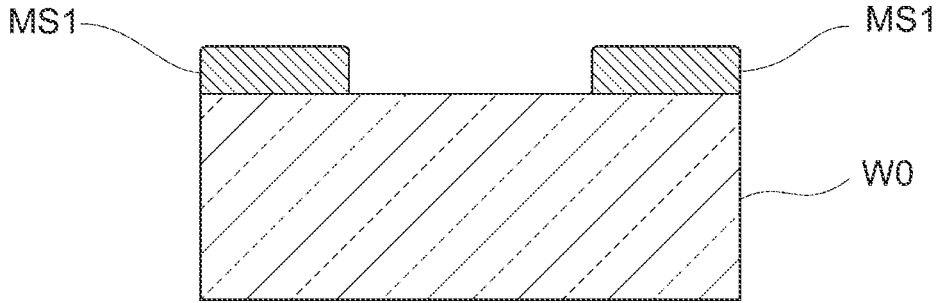
FIGS. 4A to 4H are views of a processing flow showing an example of a state in which the procedure of etching the substrate by using the etching apparatus shown in FIG. 1 to fabricate the template for nanoimprint lithography is carried out, and schematically showing an example of a state of using this template.

Using such substrate W0, an imprint pattern or the like is formed by the processing described below. In step SP1, as shown in FIG. 4A, the substrate W0 is prepared, in which a mask layer MS1 including a chromium (Cr) film or the like is patterned on the surface of the substrate W0. The mask layer MS1 is patterned by inductively coupled plasma (ICP)-reactive-ion etching (RIE) using a mixed gas of a chlorine ($Cl_2$) gas and an oxygen ($O_2$) gas, for example. Next, in step SP2, the substrates W0 are conveyed into the processing chamber 3 by the following procedure, for example.

In this step SP2, first, the shutter S1 of the holding chamber 1 is opened, and a plurality of substrates W0 are placed on the holder 11 in the holding chamber 1 from the outside. Next, the shutter S1 of the holding chamber 1 is closed, the pump P1 is operated as necessary, and an atmospheric gas inside the holding chamber 1 is exhausted to adjust the pressure thereinside. Similarly, the pump P2 and the pump P3 are operated as necessary to exhaust the atmospheric gas inside the conveyance chamber 2 and the processing chamber 3 to adjust the pressure thereinside. The pressure at this time is not particularly limited, and can be maintained to a reduced pressure of 10 Pa or less, for example and thereby the moisture on the surfaces of the substrates W0 can be volatilized.

Next, the shutter S2 of the conveyance chamber 2 is opened, and the loader 21 is driven to convey the substrates W0 on the holder 11 into the conveyance chamber 2. Subsequently, the shutter S2 is closed, the loader 21 is driven to convey the substrates W0 into the processing chamber 3, and further move the substrates from the loader 21 to the holder 31.

Figure 5:
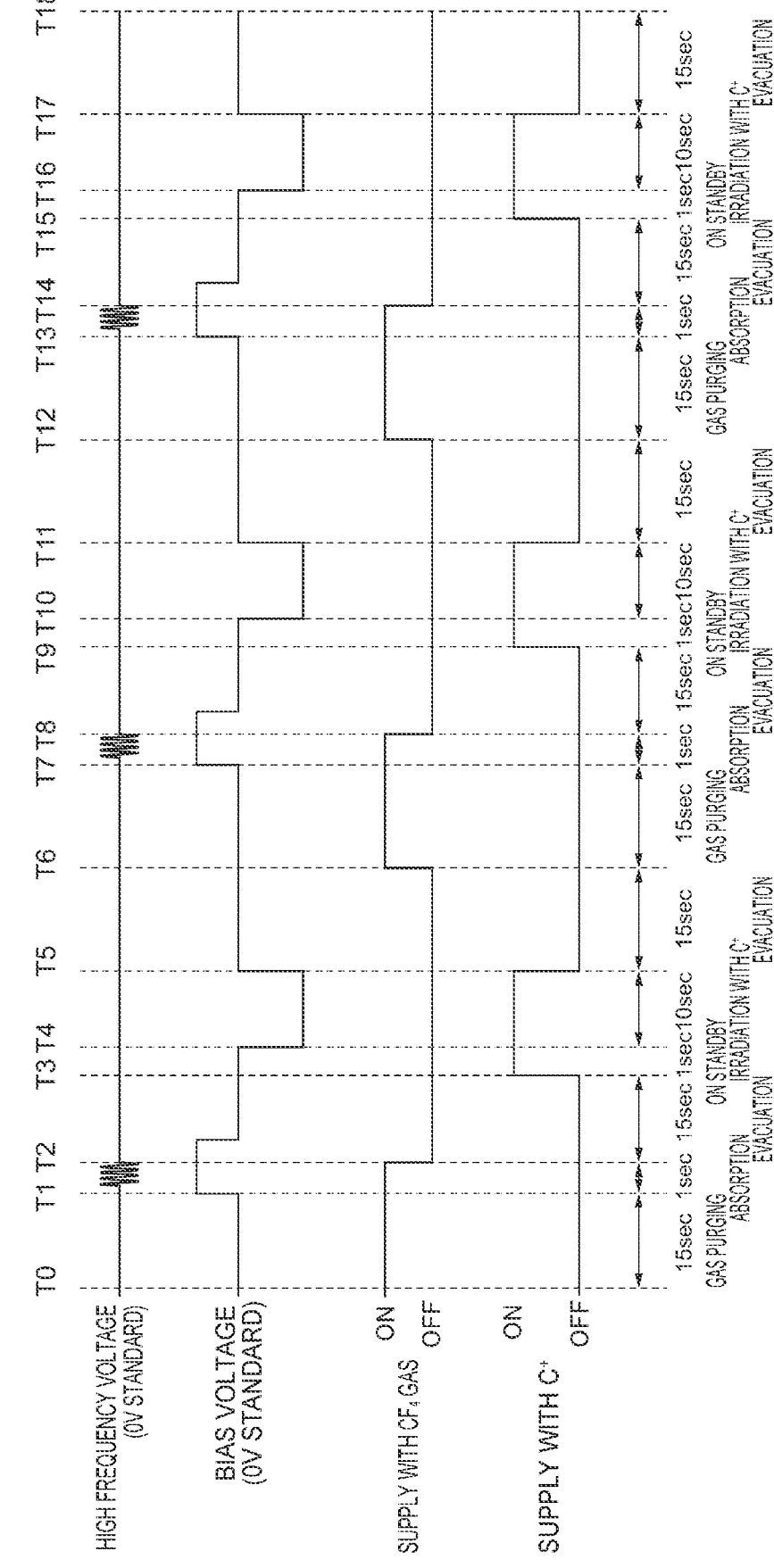
FIG. 5 is an example of a timing chart showing a sequence of a high frequency voltage control, a bias voltage control, a $CF_4$ gas supply control, and a $C^+$ supply control in a processing chamber.

In step SP3, the following processing is performed by using the processing chamber 3. FIG. 5 shows an example of a timing chart showing a sequence of the high-frequency voltage control, the bias voltage control, the $CF_4$ gas supply control, and the $C^+$ supply control in the processing chamber 3.

In this processing, first, during time T0 to time T1 (e.g., 15 seconds), the $CF_4$ gas is supplied from the gas supply source 4 into the processing chamber 3 at a predetermined flow rate by controlling the opening and closing of the on-off valve 42 by the MFC 43 so as to purge the internal gas in the processing chamber 3. At this time, no high frequency voltage and no bias voltage are applied, and no $C^+$ is supplied.

Next, during time T1 to time T2 (e.g., 1 second), the voltage controller 62 applies a high frequency (RF) voltage to the high frequency electrode 6 while the $CF_4$ gas is continuously supplied so as to generate a high frequency in the processing chamber 3. At the same time, the voltage controller 72 applies a positive bias voltage to the substrate W0 via the bias electrode 7. At this time, no $C^+$ is supplied.

Figure 4B:
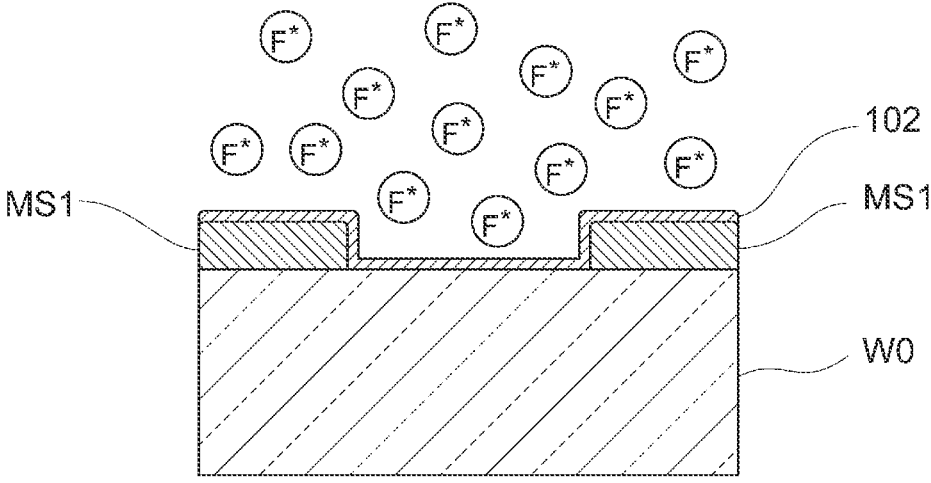

As a result, the $CF_4$ gas, which is an atmospheric gas in the processing chamber 3, is ionized, and a radical includes fluorine (for example, at least one of F* or CF*) is generated as a chemical species derived from the $CF_4$ gas. As shown in FIG. 4B, the processing chamber 3 is filled with the F*, and the F* then reaches the surfaces of an exposed portion (predetermined portion) of the substrate W0 and the mask layer MS1, to be efficiently adsorbed thereto. As a result, a surface modified layer 102 (corresponding to a "first layer") containing fluorine and having a thickness at one atomic layer level is formed (deposited) on the surfaces of the substrate W0 and the mask layer MS1. However, the operation is not limited to this.

Further, during time T2 to time T3 (e.g., 15 seconds), the supply of the $CF_4$ gas is stopped, the pump P3 is operated to evacuate the inside of the processing chamber 3 to exhaust the $CF_4$ gas therefrom. At this time, no high frequency voltage is applied, and the bias voltage is applied until immediately after time T2 as necessary, and thereafter is stopped. As described above, step SP3 (time T0 to time T3) corresponds to an example of a "first step" according to the present disclosure.

Figure 4C:
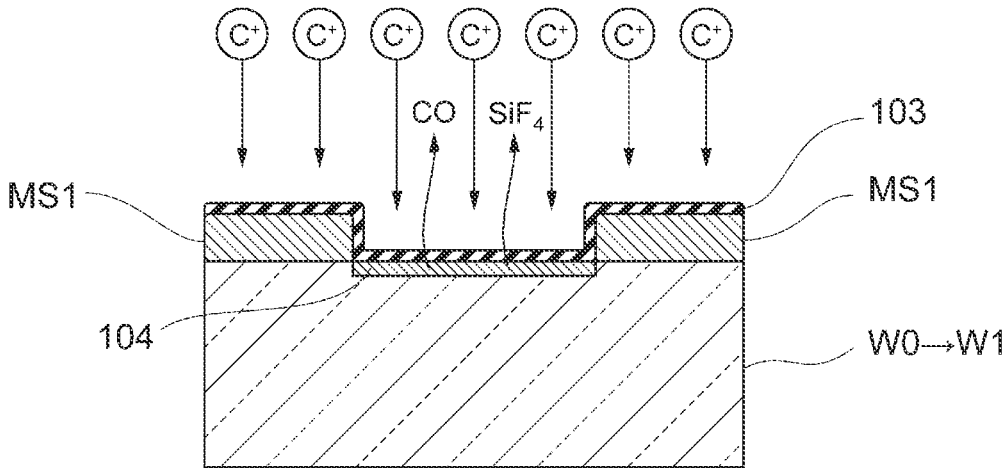

In step SP4, during time T3 to time T5 (for example, 11 seconds), the shutter S5 is opened and $C^+$ is supplied from the ion supply source 5 of the FCVA system into the processing chamber 3. At this time, no bias voltage is applied (on standby) during time T3 to time T4 (e.g., 1 second). Then, during time T4 to time T5 (e.g., 10 seconds), the voltage controller 72 applies a negative bias voltage to the substrate W0 via the bias electrode 7. At this time, no high frequency voltage is applied and no $CF_4$ gas is supplied. As shown in FIG. 4C, this $C^+$ is drawn toward the substrate W0 side due to the potential gradient and enters the surface modified layer 102 (FIG. 4B). In addition, at this time, the rate modulation unit 61 may be caused to irradiate a predetermined portion of the substrate W0 so as to converge $C^+$ to the predetermined portion.

With this supply of $C^+$, the surface modified layer 102 is reformed to a surface modified layer 103 that contains C atoms and F atoms in a stoichiometric ratio ($C_xF_y$, etc.,: x and y indicate a stoichiometric ratio). Between the surface modified layer 103 and an extremely shallow surface portion 104 (having a thickness at one atomic layer level) on the surface of the substrate W0 under the surface modified layer 103, a chemical reaction represented by the following Formula (1) occurs (also see description of the "third embodiment" described later). The reaction represented by this Formula (1) can be considered as a result from integration of the elementary reactions represented by the following Formulas (2) to (4). However, the operation is not limited thereto.

$$SiO_2 + 4F + 2C \rightarrow SiF_4 + 2CO \qquad (1)$$

$$SiO_2 \rightarrow Si + 2O \qquad (2)$$

$$Si + 4F \rightarrow SiF_4 \qquad (3)$$

$$2O + 2C \rightarrow 2CO \qquad (4)$$

As a result, $SiO_2$ by one atomic layer of the surface portion 104 is etched, thereby realizing ALE of the substrate W0. Since silicon tetrafluoride ($SiF_4$) and carbon monoxide (CO) as reaction products each have a high vapor pressure, they are easily vaporized and desorbed from the surface portion 104 and released into the processing chamber 3. Further, since no etching reaction occurs in Cr of the mask layer MS1, a high selectivity relative to the mask layer MS1 can be obtained.

Figure 4D:
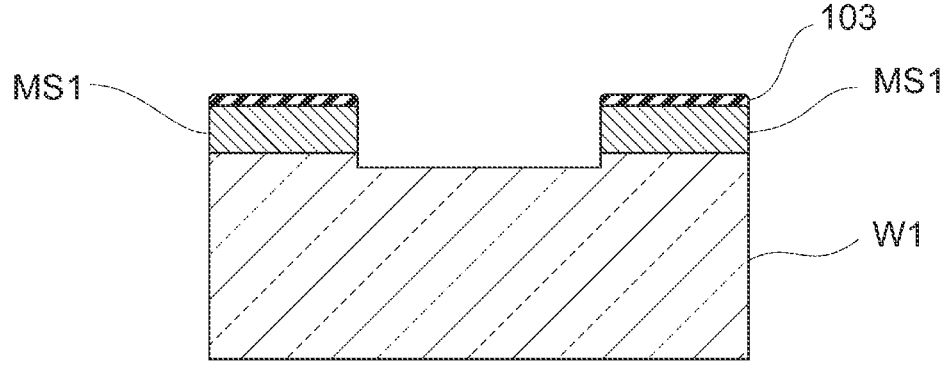

Subsequently, during time T5 to time T6 (e.g., 15 seconds), the shutter S5 is closed to stop the supply of $C^+$, and the pump P3 is operated to evacuate the inside of the processing chamber 3 to exhaust the gas components therefrom. At this time, no high frequency voltage and no bias voltage are applied, and no $CF_4$ gas is supplied. As shown in FIG. 4D, through the series of processing during time T0 to time T6 described above, the substrate W1 from which the surface portion 104 of the substrate W0 has been removed is formed. As described above, step SP4 (time T3 to time T5) corresponds to an example of a "second step" according to the present disclosure.

Figure 4E:
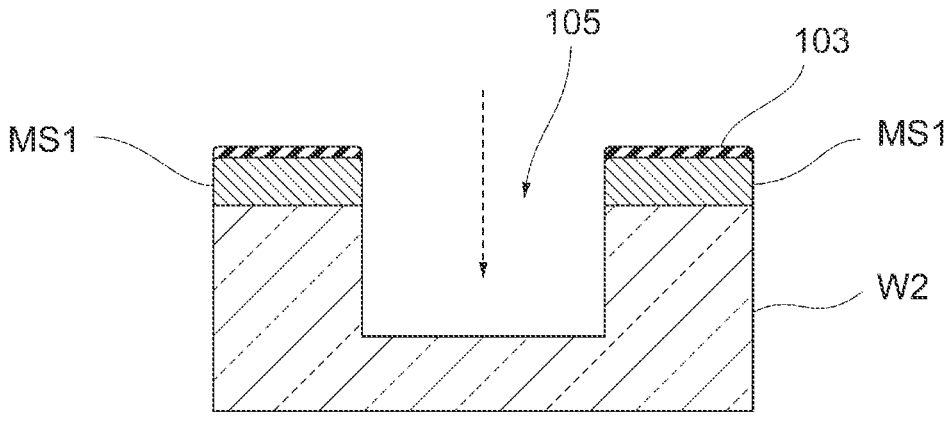

Then, during time T6 to time T12 and during time T12 to time T18, as the series of processing in steps SP3 and SP4 (time T0 to time T6) described above is repeated, the ALE in an aperture of the substrate W1 proceeds in the depth direction, as shown by a broken line arrow in FIG. 4E, thereby forming a substrate W2 with a pattern of a recess 105 having a predetermined depth.

Figure 4F:
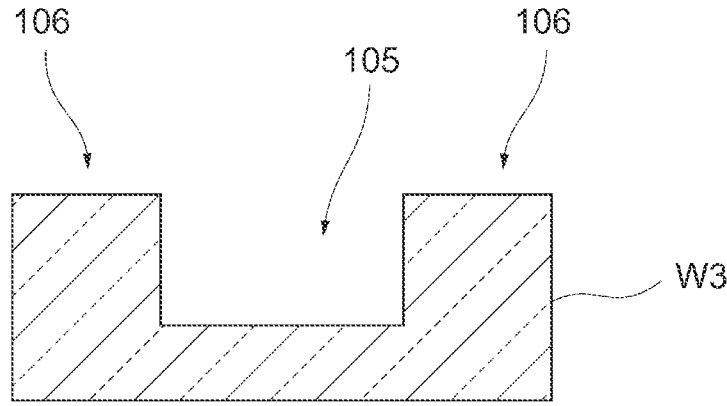

Subsequently, in step SP5, the substrate W2 shown in FIG. 4E is moved from the processing chamber 3 via the conveyance chamber 2 to the holding chamber 1 by a control operation, which is reverse to the carrying-in operation of the substrate W0 in step SP2, and then is conveyed from the holding chamber 1 to the outside. In another appropriate processing chamber, the mask layer MS1 and the surface modified layer 103 on the substrate W2 (FIG. 4E) are removed, as shown in FIG. 4F, thereby producing a template for nanoimprint lithography having the desired recess 105 and projections 106. In FIG. 4F and others, an example in which the pattern has only one recess 105 is exemplified; however, a pattern having a plurality of recesses 105 may be formed in accordance with the patterning of the mask layer MS1.

Figure 4G:
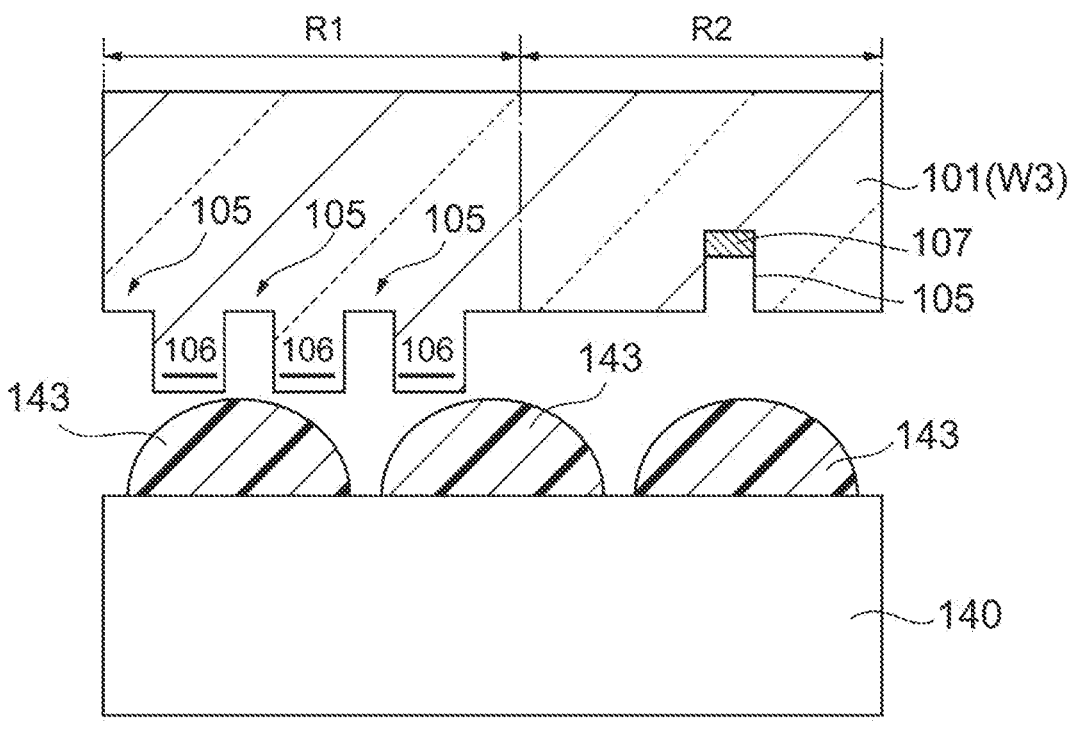
Figure 4H:
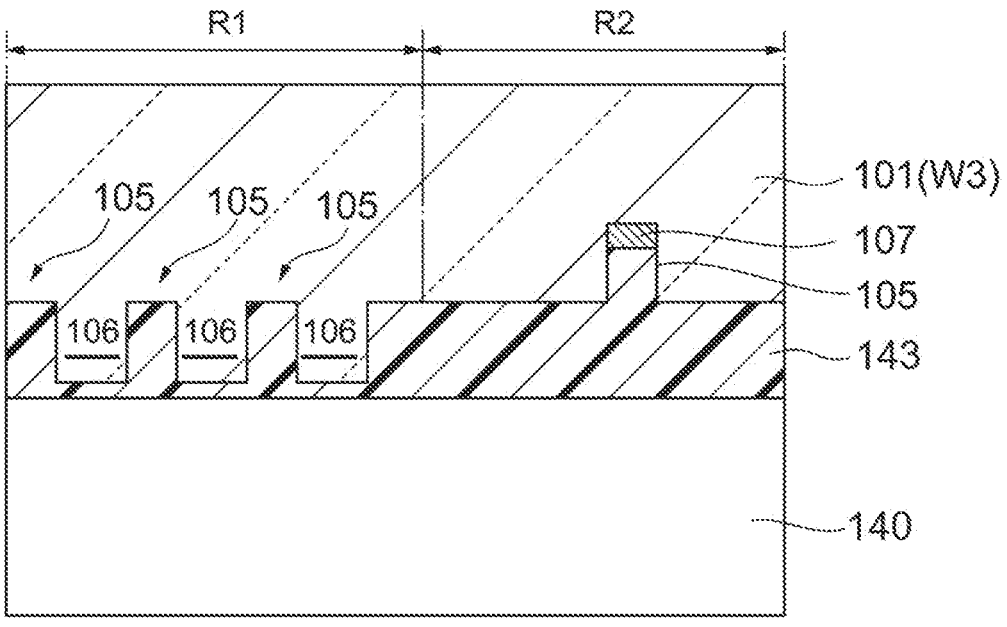

FIG. 4G is also a schematic cross-sectional view showing a template 101 (the substrate W3) for nanoimprint lithography manufactured by using the etching processing according to the respective steps SP2 to SP6. FIG. 4G schematically shows, in addition to the template 101, a target substrate 140 as an imprint target, and a resist layer 143 as an imprint (transferred) material provided on a processed surface of the target substrate 140. In this case, with an appropriate alignment, the position of the processed surface of the target substrate 140 is aligned to a pattern-forming surface of the template 101 that is arranged to face the processed surface. The template 101 has a roughness pattern having a plurality of recesses 105 and projections 106 in a region R1, and the template 101 has an optical layer 107 in the recess 105 in the region R2 including an alignment mark.

The target substrate 140 is a laminated body formed by laminating a plurality of films on a semiconductor substrate, for example (but not limited to this). The resist layer 143 on the target substrate 140 is formed by applying a resin, which is an imprint material, to the processed surface before or after the alignment. The imprint material contains a photo-curable resin, for example, and is applied on the processed surface of the target substrate 140 by dripping, spin coating, or the like.

Then, when the template 101 is pressed against the resist layer 143 of the target substrate 140, the pattern of the template 101 (the recesses 105 and the projections 106) and the alignment pattern (not shown) are transferred to the target substrate 140, and the resist layer 143 is then cured, thereby the imprint pattern and an appropriate alignment mark pattern are formed on this resist layer 143.

According to the etching apparatus 100 thus configured and the etching method using this etching apparatus 100, the following operation and effect are exhibited.

(1) In step SP3 (the first step), fluorine is adsorbed to the surface of the substrate W0 and thereby the surface modified layer 102 is obtained. Since this surface modified layer 102 is generated by atomic adsorption, the thickness thereof can be formed as a film having an extremely thin thickness at one atomic layer level. Then, in step SP4 (the second step), $C^+$ derived from the solid material is supplied to the surface modified layer 102, and then a chemical reaction occurs between the fluorine contained in the surface modified layer 102, $C^+$, and $SiO_2$ in the surface portion 104 of the substrate W0. As a result, the atomic layer etching (ALE: atomic layer etching) of the surface portion 104 of the substrate W0 is realized and thereby the surface portion 104 is peeled off by one atomic layer; therefore, the peeled surface becomes flat. Since steps SP3 and SP4 are alternately and repeatedly executed, the ALE of the substrate W0 gradually progresses and thereby the substrate W3 as the template having the rectangular recesses 105 with a flat bottom surface and no taper can be obtained. Since the decomposition products of the surface portion 104 of the substrate W0 are $SiF_4$ and CO having high vapor pressures and are easily vaporized and desorbed from the surface portion 104, they can readily be collected and removed without applying any other treatment on the surface portion 104.

(2) In other words, since it is configured that the halogen-containing gas contains fluorine and/or the ions contain $C^+$, in step SP4 (the second step), the surface modified layer 102 formed by adsorption of fluorine to the substrate, and/or a chemical reaction is caused among fluorine, $C^+$, and the substrate material, thus further promoting the ALE of the substrate surface. In addition, since the decomposition products (fluoride and carbide) of the substrate produced by the above chemical reaction has high vapor pressures and volatility, they can be readily and efficiently collected and removed without subjecting the substrate to any other treatment.

(3) As described above, according to the etching apparatus 100 and the substrate processing method using the etching apparatus 100, even in the substrate W0 with which an etching stopper is hard to be provided, it is possible to effectively prevent the recesses and the projections in the roughness pattern, formed in the substrate W3 after being processed, from being rounded by tapering off or from being tapered. Accordingly, when the substrate W3 is imprinted as the template, both the recesses and the projections in the pattern, which is transferred to the resist, become rectangular without being tapered off to be round or without being tapered. As a result, when this transferred pattern is subjected to the dry processing, it is possible to prevent excessive consumption of the resist, thus promoting enhancement in productivity and economy.

(4) Moreover, in step SP3, the surface modified layer 102 containing fluorine is formed while a positive bias voltage is being applied to the substrate W0; and in step SP4, a negative bias voltage is applied to the substrate W0 and thus $C^+$ is easily drawn to the substrate W0 side. Accordingly, the formation of the surface modified layer 102 and the ALE in the surface portion 104 of the substrate W0 by $C^+$ are promoted; therefore, the processing speed of the substrate W0 is enhanced, and the recesses 105 and the projections 106 included in the roughness pattern of the template can be efficiently formed.

(5) As the reactive ions, $C^+$ ions derived from the solid material are used; and as the ion supply source 5 of the $C^+$, the FCVA system is used; therefore, $C^+$ supplied to the substrate W0 is prevented from containing droplets (particulate radicals) (which means that the purity of $C^+$ is enhanced). Accordingly, efficiency of the reaction among fluorine contained in the surface modified layer 103, $C^+$, and $SiO_2$ in the surface portion 104 of the substrate W0 in step SP4 is further promoted, thereby further promoting the chemical reaction.

(6) Moreover, by causing the rate modulation unit 61 to irradiate the predetermined portion of the substrate W0 with $C^+$ so as to induce and converge $C^+$ thereto, the etching rate in the predetermined portion of the substrate W0 can be increased, thus reducing the process time and further enhancing the productivity.

Third Embodiment: Example of Etching Method 2

FIGS. 6A to 6F each are a process flow schematically showing an example of a method of manufacturing a semiconductor device by etching a semiconductor substrate or a silicon wafer on which an insulating film containing at least one of $SiO_2$, SiON and SiN ($Si_3N_4$) is formed, by using the etching apparatus 100 shown in FIG. 1 so as to appropriately form a conductor layer or the like thereon. For convenience of understanding, FIGS. 6A to 6F each show a cross section of a part of the substrate. Moreover, for further easier understanding, each step in this case will be described with reference to the flow shown in FIG. 2.

Figure 6A:
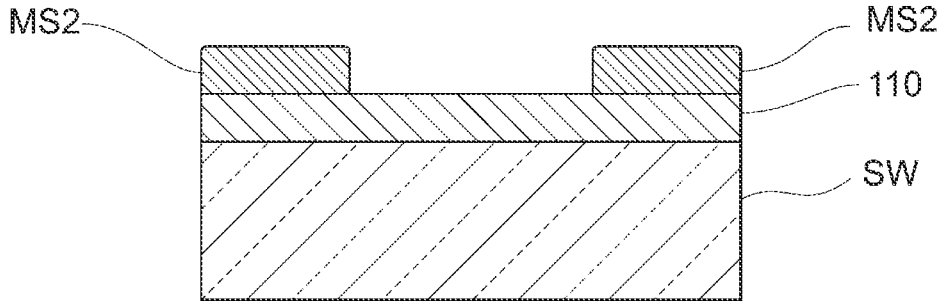

In step SP1, as shown in FIG. 6A, a substrate SW is prepared, the substrate SW being formed by patterning an appropriate mask layer MS2 on a surface of a semiconductor substrate, the surface of the semiconductor substrate on which an insulation film 110 containing at least one of $SiO_2$, SiON, and SiN ($Si_3N_4$) is already formed. Subsequently, in step SP2, the substrate SW is conveyed into the processing chamber 3 as in the case of the substrate W0. Then, in step SP3, the processing shown below is performed by using the processing chamber 3.

First, controlling the opening and closing of the on-off valve 42 by the MFC 43, the $CF_4$ gas is supplied from the gas supply source 4 into the processing chamber 3 at a predetermined flow rate, and the internal gas in the processing chamber 3 is purged. At this time, no high frequency voltage and no bias voltage are applied, and no $C^+$ is supplied.

Figure 6B:
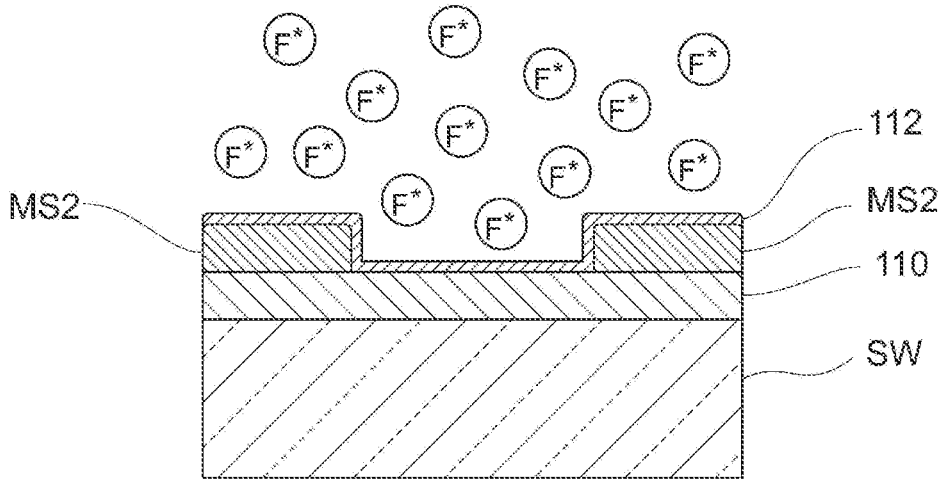

As a result, the $CF_4$ gas, which is an atmospheric gas in the processing chamber 3, is ionized, and at least a fluorine radical ($F^*$) is generated as a chemical species derived from the $CF_4$ gas. As shown in FIG. 6B, the inside of the processing chamber 3 is filled with the $F^*$, and the $F^*$ then reaches an exposed portion (the predetermined portion) of the insulation film 110 in the substrate SW and the surface of the mask layer MS2, to be efficiently adsorbed thereto. Accordingly, the surface modified layer 112 containing fluorine and having a thickness at one atomic layer level is formed (deposited) on the surfaces of the insulation film 110 and the mask layer MS2. However, the operation is not limited to this.

Subsequently, the supply of the $CF_4$ gas is stopped, and the pump P3 is operated to evacuate the inside of the processing chamber 3 to exhaust the $CF_4$ gas therefrom. At this time, no high frequency voltage is applied, and a bias voltage is applied until an appropriate time as necessary, and thereafter is stopped from being applied.

Figure 6C:
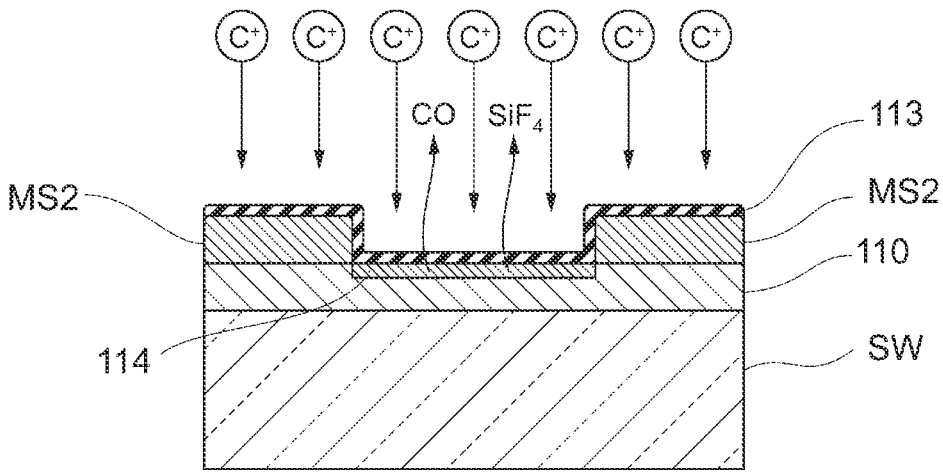

In step SP4, the shutter S5 is opened, and $C^+$ is supplied from the ion supply source 5 of the FCVA system into the processing chamber 3. At this time, no bias voltage is applied until an appropriate time (on standby). Then, the voltage controller 72 applies a negative bias voltage to the substrate SW via the bias electrode 7. At this time, no high frequency voltage is applied and no $CF_4$ gas is supplied. As shown in FIG. 6C, the $C^+$ is drawn toward the substrate SW side by the potential gradient and enters the surface modified layer 112 (FIG. 6B). Further, at this time, the rate modulation unit 61 may be caused to irradiate the predetermined portion of the substrate SW with $C^+$ so as to converge $C^+$ thereto.

With this supply of $C^+$, the surface modified layer 112 is modified to the surface modified layer 113 containing C atoms and F atoms in a stoichiometric ratio ($C_xF_y$, etc.,: x and y indicate the stoichiometric ratio). In addition, between the surface modified layer 113 and the surface portion 114 at an extremely shallow position (having a thickness at one atomic layer level) in the surface of the insulation film 110 under the surface modified layer 113, specific chemical reactions occur as shown below. However, the operation is not limited to this.

That is, in general, in the surface of a substance exposed to plasma or subjected to an ionic impact, its reactivity with other substances is enhanced. Here, examples of an index of stability of a reaction product may include bond-dissociation energy of this substance. For example, when the bond-dissociation energy is large, a strong bond is generated; therefore, a substance having a large bond-dissociation energy is likely to be readily produced. Now, examples of bond dissociation energies (kJ/mol) of various bonds that can be related to the present disclosure are shown below.

Si—O bond: 530
Si—F bond: 590
C—O bond: 340

In the insulation film 110 containing $SiO_2$, when the surface of $SiO_2$ exposed to plasma is irradiated with $C^+$, the reaction is promoted by the ionic impact, and oxygen (O) in $SiO_2$ is desorbed as CO. After that, Si can bond with fluorine (F) in the surface modified layer 113, resulting in a Si—F bond having a more stable (larger) bond dissociation energy than the Si—O bond. Further, since $SiF_4$ containing the Si—F bond is volatile, this is easily vaporized and exhausted in the vacuum chamber. It is considered that these reactions continue until the fluorine in the surface modified layer 113 is consumed, thereby completing the etching on the surface modified layer 113.

In the meantime, in the SiN ($Si_3N_4$) film, it is considered that the same reactions occur, which are triggered by the irradiation on the surface of SiN with $C^+$ and thereby the nitrogen (N) in SiN is desorbed as CN. In this case, by using the mask layer MS1 of Cr or the like, a high selectivity with respect to the mask layer MS1 can be obtained.

On the other hand, in the SiON film, the same reactions are triggered by the desorption of oxygen (O) in the SiON as CO and nitrogen (N) as CN when the surface of SiON is irradiated with $C^+$. Even in this case, by using mask layer MS1 of Cr or the like, a high selectivity with respect to the mask layer MS1 can be obtained. In consideration of the above, FIG. 6C schematically shows a state in which $SiF_4$ having a Si—F bond and CO having a C—O bond volatilize, as in FIG. 4C.

Figure 6D:
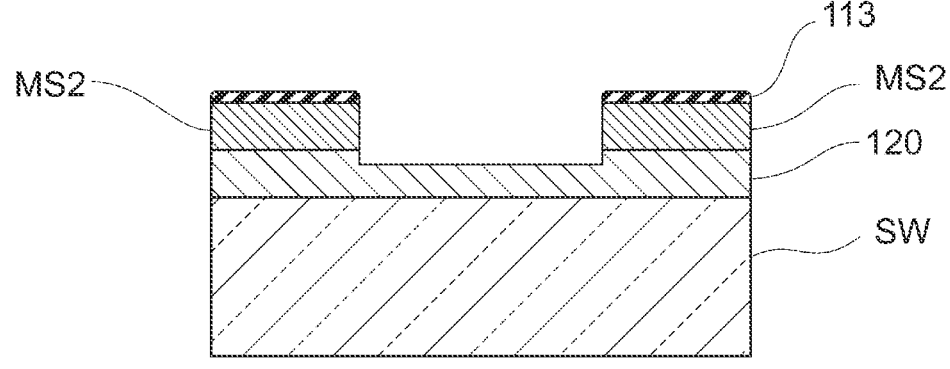

Subsequently, the shutter S5 is closed to stop the supply of $C^+$, and the pump P3 is operated to evacuate the inside of the processing chamber 3 to exhaust the gas components thereinside. At this time, no high frequency voltage and no bias voltage are applied, and no $CF_4$ gas is supplied. Through the above series of processing, as shown in FIG. 6D, the insulation film 120 in which the surface portion 114 is removed from the insulation film 110 in the substrate SW is formed.

Figure 6E:
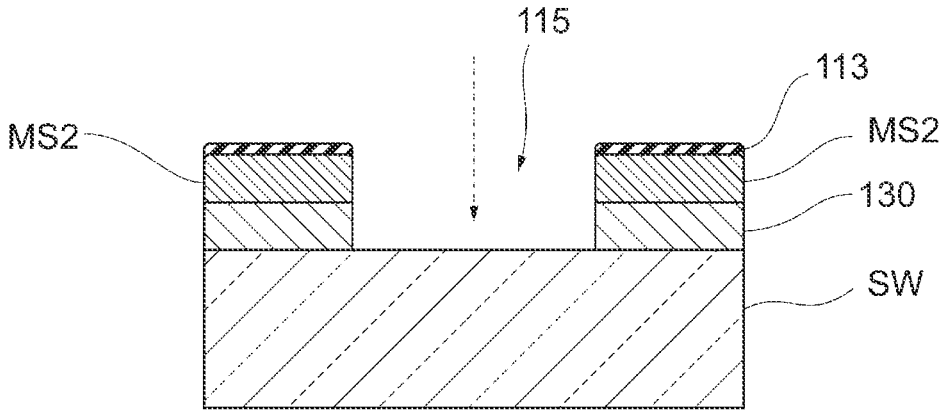

Then, by repeating the above "first step" and "second step", as shown by a broken line arrow in FIG. 6E, the ALE in the aperture of the substrate SW progresses in the depth direction, and an insulation film 130 is formed (or patterned) in the insulation film 120 with a recess 115 having a predetermined depth.

Figure 6F:
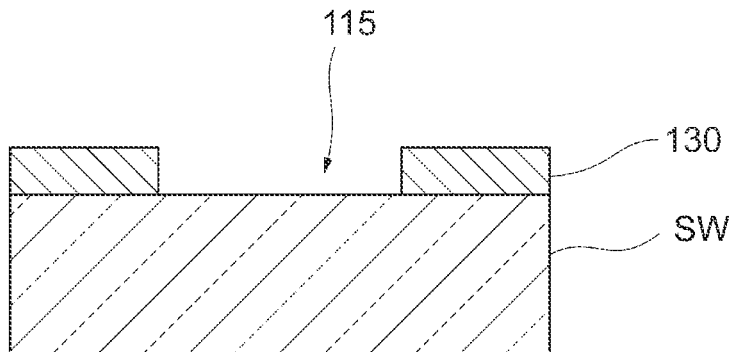

Subsequently, in step SP5, the substrate SW shown in FIG. 6E is moved from the processing chamber 3 via the conveyance chamber 2 to the holding chamber 1 by a control operation, which is reverse to the carrying-in operation of the substrate W0 in step SP 2, and the substrate SW is conveyed from the holding chamber 1 to the outside. Then, in another appropriate processing chamber, as shown in FIG. 6F, the mask layer MS2 and the surface modified layer 113 on the substrate SW are removed, thereby obtaining the substrate SW having the desired recess 105 in the insulation film 130. Thereafter, for example, a metal material or the like is embedded in the recess 105 for manufacturing a semiconductor device having the pattern.

Fourth Embodiment: Example of Semiconductor Manufacturing Using Template

FIGS. 7A to 7F each are a process flow showing an example of the procedure of the imprint processing or the like using the template for nanoimprint lithography manufactured by the etching apparatus 100 shown in FIG. 1, and this imprint processing is included in a method of manufacturing a semiconductor device, for example. It can be said that this is another example of the pattern transferring process described with reference to FIGS. 4G and 4H.

Figure 7A:
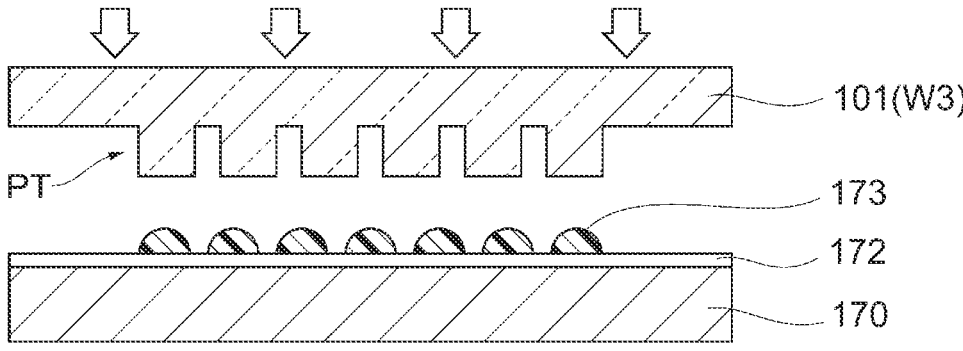
FIGS. 7A to 7F each are a process flow showing an example of the procedure of imprint processing or the like using the template for nanoimprint lithography manufactured by the etching apparatus 100 shown in FIG. 1.

First, as shown in FIG. 7A, a processed film 172 is formed as necessary on a target substrate 170 (e.g., a laminated body formed by laminating multiple films on a semiconductor substrate), and this target substrate 170 is placed on an appropriate mounting table. Subsequently, droplets of a resin as an imprint material are dropped onto the processed film 172 of the target substrate 170 so as to form a resist layer 173. At this time, at least one of the amount of dropping per drop, the amount of dropping per unit area in the target substrate 170 for droplets, the dropping position on the target substrate 170, and the number of dropping onto target substrate 170 is adjusted. The dropping position and the number of dropping onto the target substrate 170 are recorded in a drop recipe, for example. Also, at this time, the moving speed of the target substrate 170 along with the mounting table in the scan direction is controlled, thereby controlling dropping intervals of the droplets in the scan direction. Then, the template 101 (W3) formed with a pattern PT is placed to face the surface of the target substrate 170.

Figure 7B:
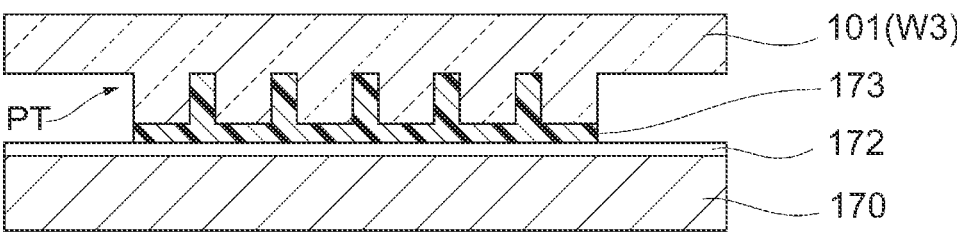

Next, as shown in FIG. 7B, the template 101 is moved in a direction toward the target substrate 170 on the mounting table (downward in the drawing). At this time, while aligning the template 101 with the target substrate 170 by using an alignment sensor or the like, the pattern PT formed on the template 101 is controlled to be pressed against the resist layer 173. After this state is maintained for a predetermined time, the resist layer 173 in a liquid state spreads between the template 101 and the target substrate 170, thereby filling the recesses of the pattern PT of the template 101.

Figure 7C:
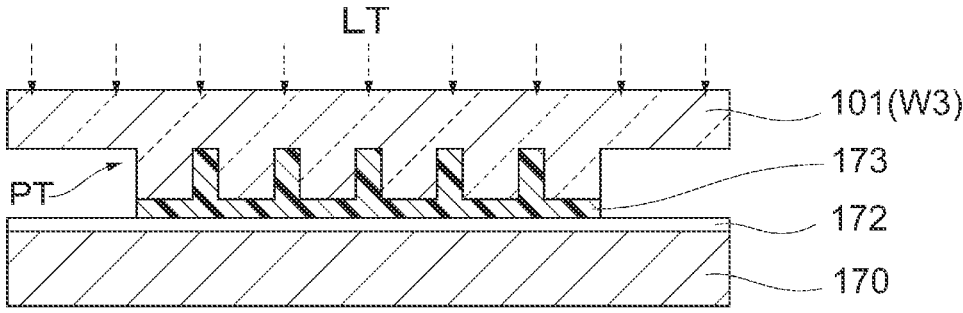
Figure 7D:
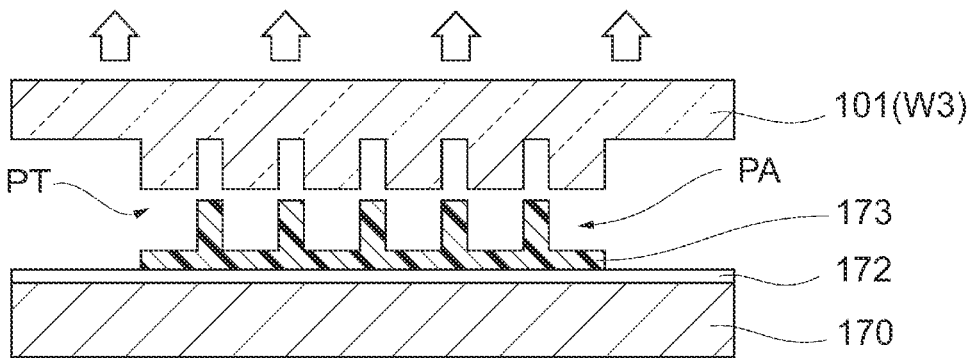

Subsequently, as shown in FIG. 7C, while the template 101 is pressed against the target substrate 170, the resist layer 173 is irradiated with an optical LT such that the resist layer 173 is cured. Next, as shown in FIG. 7D, the template 101 is released. Accordingly, a transferred region PA to which the pattern PT of the template 101 is transferred is formed on the processed film 172 of the target substrate 170. Through this processing, a supply layer 173a configured by the resist layer 173 to which the pattern PT is transferred comes into a state of being formed on the target substrate 170. As described above, through the steps in FIGS. 7A to 7D, the imprint processing is executed in which the pattern PT formed on the template 101 is transferred to the resist layer 173 as an example of the transferred material on the target substrate 170.

Figure 7E:
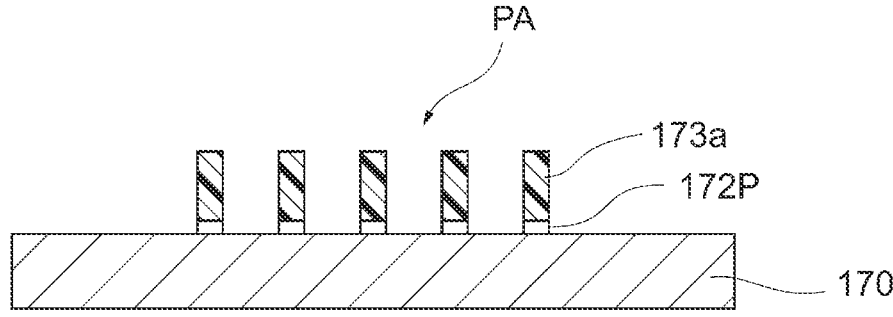
Figure 7F:
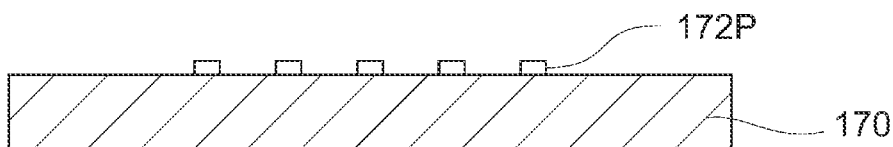

Thereafter, the processing shown in FIGS. 7E and 7F is performed. In this processing, as shown in FIG. 7E, the processed film 172 is processed by using the transferred region PA as a mask. With this, a pattern 172P of the processed film 172 is formed corresponding to the pattern PT. Then, as shown in FIG. 7F, the supply layer 173a derived from the resist layer 173 is peeled off by ashing or the like, thereby obtaining the pattern 172P of the processed film 172 formed on the target substrate 170. The above processing is repeated to laminate a plurality of patterns 172A of the processed film 172 on the target substrate 170 for manufacturing the semiconductor device.

Modifications

As Modification 2, the etching apparatus 100 according to the present disclosure can also be used for applications other than the formation of the template for nanoimprint lithography. For example, the etching apparatus 100 can be utilized as a film forming apparatus of a carbon (C) film, without performing irradiation with $C^+$ (in a state in which the shutter S5 is closed), by supplying a hydrocarbon gas such as acetylene ($C_2H_2$) and methane ($CH_4$) from the gas supply source 4 into the processing chamber 3 in which substrates such as semiconductor substrates are accommodated, by applying a high frequency voltage to the high frequency electrode 6 so as to ionize the gas into $C^+$, and by applying an appropriate bias voltage to the substrate.

Further, the etching apparatus 100 can be utilized as a dry cleaning apparatus or a ashing apparatus for a substrate surface, without performing irradiation with $C^+$ (in a state in which the shutter S5 is closed), by supplying an inert gas such as argon (Ar), neon (Ne), nitrogen ($N_2$), and oxygen ($O_2$), for example from the gas supply source 4 into the processing chamber 3 in which substrates such as semiconductor substrates are accommodated, by applying a high frequency voltage to the high frequency electrode 6 so as to ionize the gas, and by applying an appropriate bias voltage to the substrate.

As aforementioned, the above-described embodiments and modifications have been described in detail as examples of the present disclosure; however, the above-mentioned description is merely examples of the present disclosure in all respects; and it is needless to mention that various improvements and modifications can be made without departing from the scope of the present disclosure. Further, the above-described embodiments can be partially replaced, deleted, or configured in combination. For example, the substrate W3 after being processed may be directly conveyed to the outside from the processing chamber 3. Further, it is not necessary to generate plasma by discharging the $CF_4$ gas in the processing chamber 3 at a high frequency; however, from the viewpoint of enhancement in adsorption of fluorine on the surface of the substrate W0, it is preferable. Further, each processing time in the timing chart shown in FIG. 5 can be changed as appropriate. Furthermore, the number of repetitions of steps SP3 and SP4 is not limited to three, and may be appropriately changed in accordance with the setting depth of the recess 105 and the processing conditions thereof.

What is claimed is:

1. An etching method comprising:
performing a first process which includes forming a first layer containing halogen on a substrate by supplying the substrate with a gas containing halogen or holding the substrate in a gas atmosphere containing halogen; and
performing a second process which includes removing a portion of the first layer and a portion of the substrate under the portion of the first layer by supplying the portion of the first layer with ions sourced from a solid material,
wherein the ions are extracted from a product by filtering the product with an electromagnetic space filter, the product being generated by arcing the solid material.

2. The etching method according to claim 1, wherein
the forming the first layer includes applying a positive bias voltage to the substrate,
the removing the portion of the first layer and the portion of the substrate includes applying a negative bias voltage to the substrate, and
the first process and the second process are alternately performed.

3. The etching method according to claim 1, wherein
the gas containing halogen further contains fluorine.

4. The etching method according to claim 1, wherein the ions contain carbon ions.

5. The etching method according to claim 1, wherein the substrate contains silicon and at least one of oxygen or nitrogen.

6. A method of manufacturing a semiconductor device including the etching method according to claim 1, wherein the substrate includes a semiconductor substrate.

7. A method of manufacturing a template including the etching method according to claim 1, wherein the substrate includes a translucent material.

\* \* \* \* \*